US008587996B2

(12) United States Patent
Luthra

(10) Patent No.: US 8,587,996 B2
(45) Date of Patent: *Nov. 19, 2013

(54) TECHNIQUES FOR PROVIDING A DIRECT INJECTION SEMICONDUCTOR MEMORY DEVICE

(75) Inventor: Yogesh Luthra, Chavannes-pres-Renens (CH)

(73) Assignee: Micron Technology, Inc., Boise, ID (US)

( * ) Notice: Subject to any disclaimer, the term of this patent is extended or adjusted under 35 U.S.C. 154(b) by 324 days.

This patent is subject to a terminal disclaimer.

(21) Appl. No.: 12/843,212

(22) Filed: Jul. 26, 2010

(65) Prior Publication Data

US 2011/0019481 A1  Jan. 27, 2011

Related U.S. Application Data

(60) Provisional application No. 61/228,934, filed on Jul. 27, 2009.

(51) Int. Cl.
G11C 11/39 (2006.01)
G11C 11/35 (2006.01)
G11C 11/40 (2006.01)

(52) U.S. Cl.
USPC ............................ 365/180; 365/174; 365/182

(58) Field of Classification Search
USPC .......... 365/174, 180, 182; 257/133, 135, 137, 257/138, 140, 143, 146, 110, 167
See application file for complete search history.

(56) References Cited

U.S. PATENT DOCUMENTS 3,439,214 A    4/1969  Kabell
3,997,799 A   12/1976  Baker
4,032,947 A    6/1977  Kesel et al.
(Continued)

FOREIGN PATENT DOCUMENTS

CA       272437      7/1927
EP      0 030 856    6/1981
(Continued)

OTHER PUBLICATIONS

Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.

(Continued)

Primary Examiner — Hoai V Ho
Assistant Examiner — Jay Radke
(74) Attorney, Agent, or Firm — Wilmer Cutler Pickering Hale and Dorr LLP

(57) ABSTRACT

Techniques for providing a direct injection semiconductor memory device are disclosed. In one particular exemplary embodiment, the techniques may be realized as a method for biasing a direct injection semiconductor memory device including the steps of applying a first non-negative voltage potential to a first region via a bit line and applying a second non-negative voltage potential to a second region via a source line. The method may also include applying a third voltage potential to a word line, wherein the word line may be spaced apart from and capacitively to a body region that may be electrically floating and disposed between the first region and the second region. The method may further include applying a fourth positive voltage potential to a third region via a carrier injection line, wherein the third region may be disposed below at least one of the first region, the body region, and the second region.

23 Claims, 7 Drawing Sheets

(56) References Cited

U.S. PATENT DOCUMENTS

| | | |
|---|---|---|
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa et al. |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,229,161 B1 * | 5/2001 | Nemati et al. ................. 257/133 |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portman et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |

(56) References Cited

U.S. PATENT DOCUMENTS

| | | |
|---|---|---|
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,372,734 B2 | 5/2008 | Wang |
| 7,416,943 B2 | 8/2008 | Figura et al. |
| 7,456,439 B1 | 11/2008 | Horch |
| 7,459,748 B2 | 12/2008 | Shirota et al. |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 8,139,418 B2 | 3/2012 | Carman |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0021984 A1 | 1/2009 | Wang |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |

(56) References Cited

FOREIGN PATENT DOCUMENTS

| | | |
|---|---|---|
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| JP | H04-176163 A | 6/1922 |
| JP | 1 414 228 | 11/1975 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto et al., A Configurable Enhanced T2RAM Macro for System-Level Power Management Unified Memory, 2006, VLSI Symposium.

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06. International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

(56) References Cited

OTHER PUBLICATIONS

Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multifunctional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architectureof Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., " Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless It DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).
Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. On El. Dev.
Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Giga-bit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI Flash Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces Responsible for Junction Leakage on SOI, May 2009, ICSI.
Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.
Lu et al., A Novel Two-Transistor Floating Body/Gate Cell for Low Power Nanoscale Embedded DRAM, 2008, IEEE Trans. On El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

(56) References Cited

OTHER PUBLICATIONS

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI), 2005, CICC.

Morishita, F. et al., "A Configurable Enhanced TTRAM Macro for System-Level Power Management Unified Memory, IEEE Journal of Solid-State Circuits", vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562µm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Paella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less Dram Memory, SOI Conference, 2009 IEEE International, Oct. 5-8, 2009 pp. 1-2.

Roy, Thyristor-Based Volatile Memory in Nano-Scale CMOS, 2006, ISSCC.

Sailing et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

(56) References Cited

OTHER PUBLICATIONS

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

\* cited by examiner

FIGURE 4

| Step | 1 | 2 | 3 | 4 | 5 | 6 | 7 |
|---|---|---|---|---|---|---|---|
| Operation | Hold | Preparation to Start | Read | Write 1 | Write 0 | Preparation to End | Hold |
| Waveform | WL=-1.5V<br>EP=0.7V<br>EN=0V<br>CN=0.7V | EN("Mask")=0V<br>→0.7V<br>CN=1.1V | WL=0V<br>EN("Mask")=0.7V | WL=-1V<br>CN=0V | WL=-1V<br>CN=1.1V | WL=0.4V | WL=-1.5V<br>CN=0.7V |
| Inactive bitcell on active row | EN=0V<br>CP<br>WL=-1.5V<br>EP=0.7V<br>CN=0.7V | EN("Mask")=0V<br>→0.7V<br>CP<br>WL=-1.5V<br>EP=0.7V<br>CN=0.7V<br>→1.1V | EN("Mask")=0.7V<br>CP<br>WL=-1.5V<br>→0V<br>EP=0.7V<br>CN=1.1V | EN("Mask")=0.7V<br>CP<br>WL=0V<br>→-1V<br>EP=0.7V<br>CN=1.1V<br>→0V | EN("Mask")=0.7V<br>CP<br>WL=-1V<br>→-0.4V<br>EP=0.7V<br>CN=0V<br>→1.1V | EN("Mask")=0.7V<br>→0V<br>CP<br>WL=0.4V<br>→-1.5V<br>EP=0.7V<br>CN=1.1V<br>→0.7V | EN("Mask")=0V<br>CP<br>WL=-1.5V<br>EP=0.7V<br>CN=0.7V |

FIGURE 5

TECHNIQUES FOR PROVIDING A DIRECT INJECTION SEMICONDUCTOR MEMORY DEVICE

CROSS-REFERENCE TO RELATED APPLICATIONS

This patent application claims priority to U.S. Provisional Patent Application No. 61/228,934, filed Jul. 27, 2009, which is hereby incorporated by reference herein in its entirety.

FIELD OF THE DISCLOSURE

The present disclosure relates generally to semiconductor memory devices and, more particularly, to techniques for providing a direct injection semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Silicon-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (for example, double, triple, or surrounding gate), and Fin-FET devices.

A semiconductor memory device may include a memory cell having a memory transistor with an electrically floating body region wherein electrical charges may be stored. When excess majority electrical charge carriers are stored in the electrically floating body region, the memory cell may store a logic high (e.g., binary "1" data state). When the electrical floating body region is depleted of majority electrical charge carriers, the memory cell may store a logic low (e.g., binary "0" data state). Also, a semiconductor memory device may be fabricated on silicon-on-insulator (SOI) substrates or bulk substrates (e.g., enabling body isolation). For example, a semiconductor memory device may be fabricated as a three-dimensional (3-D) device (e.g., multiple gate devices, Fin-FETs, recessed gates and pillars) on a silicon-on-insulator (SOI) or bulk substrates.

In one conventional technique, the memory cell of the semiconductor memory device may be read by applying bias signals to a source/drain region(s) and/or a gate of the memory transistor. As such, a conventional reading technique may involve sensing an amount of current provided/generated by/in the electrically floating body region of the memory cell in response to the application of the source/drain region and/or gate bias signals to determine a data state stored in the memory cell. For example, the memory cell may have two or more different current states corresponding to two or more different logical states (e.g., two different current conditions/states corresponding to two different logic states: a binary "0" data state and a binary "1" data state).

In another conventional technique, the memory cell of the semiconductor memory device may be written to by applying bias signals to the source/drain region(s) and/or the gate of the memory transistor. As such, a conventional writing technique may result in an increase/decrease of majority charge carriers in the electrically floating body region of the memory cell which, in turn, may determine the data state of the memory cell. An increase of majority charge carriers in the electrically floating body region may result from impact ionization, band-to-band tunneling (gate-induced drain leakage "GIDL"), or direct injection. A decrease of majority charge carriers in the electrically floating body region may result from charge carriers being removed via drain region charge carrier removal, source region charge carrier removal, or drain and source region charge carrier removal, for example, using back gate pulsing.

Often, conventional reading and/or writing operations may lead to relatively large power consumption and large voltage potential swings which may cause disturbance to unselected memory cells in the semiconductor memory device. Also, pulsing between positive and negative gate biases during read and write operations may reduce a net quantity of majority charge carriers in the electrically floating body region of the memory cell in the semiconductor memory device, which, in turn, may result in an inaccurate determination of the state of the memory cell. Furthermore, in the event that a bias is applied to the gate of the memory transistor that is below a threshold voltage potential of the memory transistor, a channel of minority charge carriers beneath the gate may be eliminated. However, some of the minority charge carriers may remain "trapped" in interface defects. Some of the trapped minority charge carriers may recombine with majority charge carriers, which may be attracted to the gate as a result of the applied bias. As a result, the net quantity of majority charge carriers in the electrically floating body region may be reduced. This phenomenon, which is typically characterized as charge pumping, is problematic because the net quantity of majority charge carriers may be reduced in the electrically floating body region of the memory cell, which, in turn, may result in an inaccurate determination of the state of the memory cell.

In view of the foregoing, it may be understood that there may be significant problems and shortcomings associated with conventional techniques for fabricating and/or operating semiconductor memory devices.

SUMMARY OF THE DISCLOSURE

Techniques for providing a direct injection semiconductor memory device are disclosed. In one particular exemplary embodiment, the techniques may be realized as a method for biasing a direct injection semiconductor memory device comprising the steps of applying a first non-negative voltage potential to a first region via a bit line and applying a second non-negative voltage potential to a second region via a source line. The method may also comprise applying a third voltage potential to a word line, wherein the word line may be spaced apart from and capacitively to a body region that may be electrically floating and disposed between the first region and the second region. The method may further comprise applying a fourth positive voltage potential to a third region via a carrier injection line, wherein the third region may be disposed below at least one of the first region, the body region, and the second region.

In accordance with other aspects of the particular exemplary embodiment, the method may further comprise increasing the third voltage potential applied to the word line from the third voltage potential applied to the word line during a hold operation to perform a read operation.

In accordance with further aspects of this particular exemplary embodiment, the method may further comprise increasing the second non-negative voltage potential applied to the source line from the second non-negative voltage potential applied to the source line during the hold operation to perform the read operation.

In accordance with additional aspects of this particular exemplary embodiment, the method may further comprise increasing the first non-negative voltage potential applied to the bit line from the first non-negative voltage potential applied to the bit line during the hold operation in order to reduce a disturbance during the read operation.

In accordance with yet another aspect of this particular exemplary embodiment, the method may further comprise increasing the second non-negative voltage potential applied to the source line from the second non-negative voltage potential applied to the source line during a hold operation to perform a preparation to start operation.

In accordance with other aspects of the particular exemplary embodiment, the method may further comprise decreasing the second non-negative voltage potential applied to the source line from the second non-negative voltage potential applied to the source line during a hold operation to perform a write logic high operation.

In accordance with further aspects of this particular exemplary embodiment, the method may further comprise increasing the third voltage potential applied to the word line from the third voltage potential applied to the word line during the hold operation to perform the write logic high operation.

In accordance with additional aspects of this particular exemplary embodiment, the method may further comprise maintaining the first non-negative voltage potential applied to the bit line from the first non-negative voltage potential applied to the bit line during the hold operation to perform the write logic high operation.

In accordance with yet another aspect of this particular exemplary embodiment, the method may further comprise increasing the third voltage potential applied to the word line from the third voltage potential applied to the word line during a hold operation to perform a write logic low operation.

In accordance with other aspects of the particular exemplary embodiment, the method may further comprise increasing the second non-negative voltage potential applied to the source line from the second non-negative voltage potential applied to the source line during the hold operation to perform the write logic low operation.

In accordance with further aspects of this particular exemplary embodiment, the method may further comprise maintaining the first non-negative voltage potential applied to the bit line from the first non-negative voltage potential applied to the bit line during the hold operation to perform the write logic low operation.

In accordance with additional aspects of this particular exemplary embodiment, the method may further comprise increasing the first non-negative voltage potential applied to the bit line during the write logic low operation from the first non-negative voltage potential applied to the bit line during the hold operation to maintain a logic high stored in the memory cell.

In another exemplary embodiment, the technique may be realized as a method for biasing a direct injection semiconductor memory device may comprise the steps of applying a first voltage potential to a first region via a bit line, wherein the first voltage potential may be positive during a hold operation and applying a second voltage potential to a second region via a source line, wherein the second voltage potential may be positive during the hold operation. The method may also comprise applying a third voltage potential to a word line, wherein the word line may be spaced apart from and capacitively to a body region that may be electrically floating and disposed between the first region and the second region. The method may further comprise applying a fourth voltage potential to a third region via a carrier injection line, wherein the fourth voltage potential may be positive during the hold operation, wherein the third region may be disposed below at least one of the first region, the body region, and the second region.

In accordance with other aspects of the particular exemplary embodiment, the method may further comprise increasing the third voltage potential applied to the word line from the third voltage potential applied to the word line during the hold operation to perform a read operation.

In accordance with further aspects of this particular exemplary embodiment, the method may further comprise increasing the second voltage potential applied to the source line from the second positive voltage potential applied to the source line during the hold operation to perform the read operation.

In accordance with additional aspects of this particular exemplary embodiment, the method may further comprise decreasing the first voltage potential applied to the bit line from the first voltage potential applied to the bit line during the hold operation to perform the read operation.

In accordance with yet another aspect of this particular exemplary embodiment, the method may further comprise decreasing the first voltage potential applied to the bit line from the first voltage potential applied to the bit line during the hold operation to perform a preparation to start operation.

In accordance with other aspects of the particular exemplary embodiment, the method may further comprise increasing the second voltage potential applied to the source line from the second non-negative voltage potential applied to the source line during a hold operation to perform a preparation to start operation.

In accordance with further aspects of this particular exemplary embodiment, the method may further comprise decreasing the second voltage potential applied to the source line from the second voltage potential applied to the source line during the hold operation to perform a write logic high operation.

In accordance with additional aspects of this particular exemplary embodiment, the method may further comprise increasing the third voltage potential applied to the word line from the third voltage potential applied to the word line during the hold operation to perform the write logic high operation.

In accordance with yet another aspect of this particular exemplary embodiment, the method may further comprise increasing the first voltage potential applied to the bit line from the first voltage potential applied to the bit line during a read operation to perform the write logic high operation.

In accordance with other aspects of the particular exemplary embodiment, the method may further comprise increasing the third voltage potential applied to the word line from the third voltage potential applied to the word line during the hold operation to perform a write logic low operation.

In accordance with further aspects of this particular exemplary embodiment, the method may further comprise increasing the second voltage potential applied to the source line from the second voltage potential applied to the source line during the hold operation to perform the write logic low operation.

In accordance with additional aspects of this particular exemplary embodiment, the method may further comprise decreasing the first voltage potential applied to the bit line from the first voltage potential applied to the bit line during the hold operation to perform the write logic low operation.

In accordance with yet another aspect of this particular exemplary embodiment, the method may further comprise increasing the first non-negative voltage potential applied to the bit line during the write logic low operation from the first non-negative voltage potential applied to the bit line during the hold operation to maintain a logic high stored in the memory cell.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 4 shows control signal voltage waveforms for performing a refresh operation on a memory cell in accordance with an embodiment of the present disclosure.

FIG. 5 shows control signal voltage waveforms for performing a masking operation on one or more unselected memory cells along an active row to reduce a disturbance during active operations in accordance with an embodiment of the present disclosure.

DETAILED DESCRIPTION OF EXEMPLARY EMBODIMENTS

Figure 1:
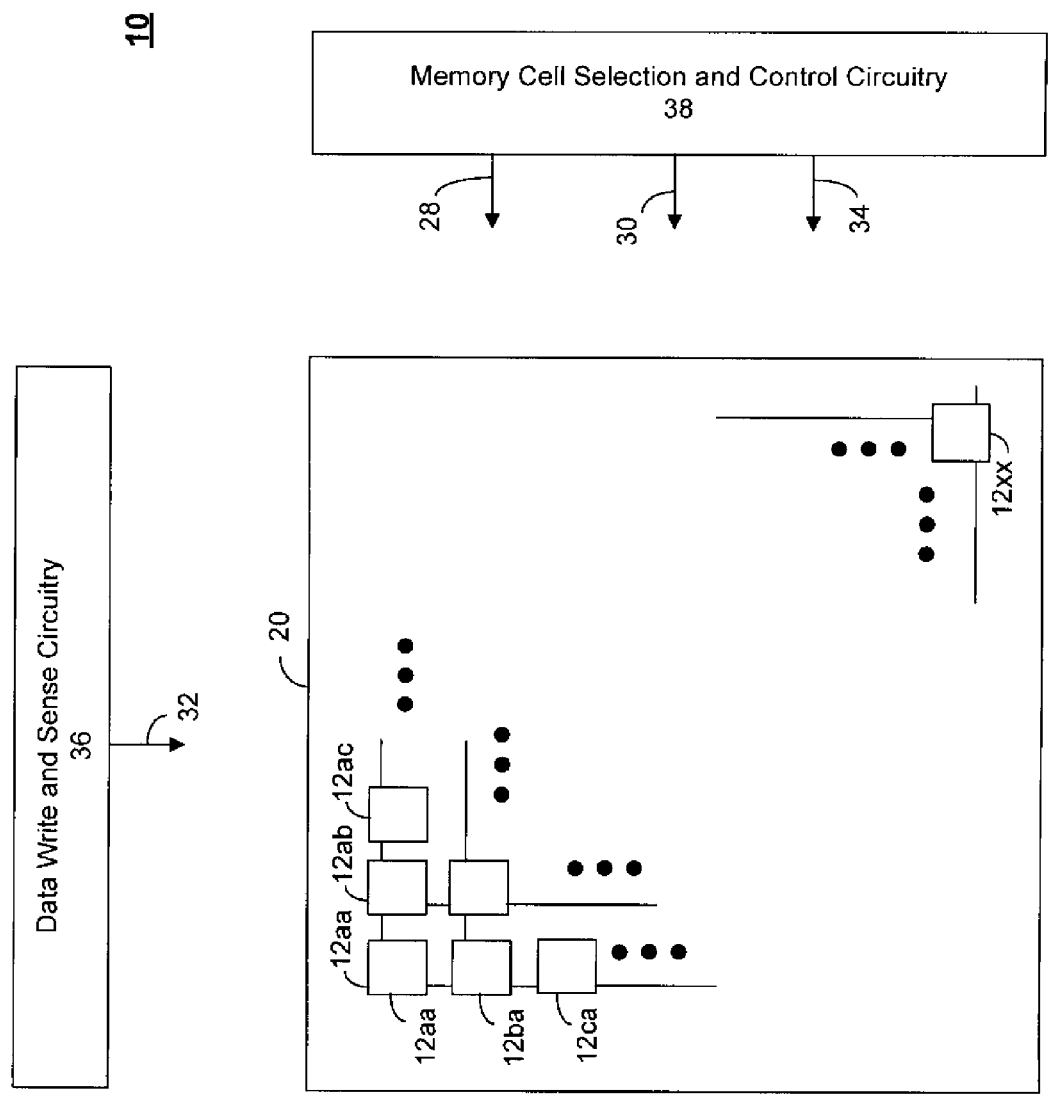
FIG. 1 shows a schematic block diagram of a semiconductor memory device including a memory cell array, data write and sense circuitry, and memory cell selection and control circuitry in accordance with an embodiment of the present disclosure.

Referring to FIG. 1, there is shown a schematic block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a word line (WL) 28, a source line (CN) 30, and/or a carrier injection line (EP) 34, and the data write and sense circuitry 36 via a bit line (EN) 32. It may be appreciated that the source line (ON) 30 and the bit line (EN) 32 are designations used to distinguish between two signal lines and they may be used interchangeably.

The data write and sense circuitry 36 may read data from and may write data to selected memory cells 12. In an exemplary embodiment, the data write and sense circuitry 36 may include a plurality of data sense amplifiers. Each data sense amplifier may receive at least one bit line (EN) 32 and a current or voltage reference signal. For example, each data sense amplifier may be a cross-coupled type sense amplifier to sense a data state stored in a memory cell 12. Also, each data sense amplifier may employ voltage and/or current sensing circuitry and/or techniques. In an exemplary embodiment, each data sense amplifier may employ current sensing circuitry and/or techniques. For example, a current sense amplifier may compare current from a selected memory cell 12 to a reference current (e.g., the current of one or more reference cells). From that comparison, it may be determined whether the selected memory cell 12 contains a logic high (e.g., binary "1" data state) or a logic low (e.g., binary "0" data state). It may be appreciated by one having ordinary skill in the art that various types or forms of data write and sense circuitry 36 (including one or more sense amplifiers, using voltage or current sensing techniques, using or not reference cells, to sense a data state stored in a memory cell 12) may be employed to read data stored in memory cells 12 and/or write data to memory cells 12.

The memory cell selection and control circuitry 38 may select and/or enable one or more predetermined memory cells 12 to facilitate reading data therefrom and/or writing data thereto by applying control signals on one or more word lines (WL) 28, source lines (ON) 30, and/or carrier injection lines (EP) 34. The memory cell selection and control circuitry 38 may generate such control signals from address signals, for example, row address signals. Moreover, the memory cell selection and control circuitry 38 may include a word line decoder and/or driver. For example, the memory cell selection and control circuitry 38 may include one or more different control/selection techniques (and circuitry therefore) to select and/or enable one or more predetermined memory cells 12. Notably, all such control/selection techniques, and circuitry therefore, whether now known or later developed, are intended to fall within the scope of the present disclosure.

In an exemplary embodiment, the semiconductor memory device may implement a two step write operation whereby all the memory cells 12 in a row of memory cells 12 may be first written to a first predetermined data state. For example, the memory cells 12 in a row of memory cell array 20 may be first written to a logic high (e.g., binary "1" data state) by executing a logic high (e.g., binary "1" data state) write operation. Thereafter, selected memory cells 12 in the active row of memory cell array 20 may be selectively written to a second predetermined data state. For example, selected memory cells 12 in the active row of the memory cell array 20 may be selectively written to a logic low (e.g., binary "0" data state) by executing a logic low (e.g., binary "0" data state) write operation. The semiconductor memory device 10 may also implement a one step write operation whereby selected memory cells 12 in an active row of memory cells 12 may be selectively written to either a logic high (e.g., binary "1" data state) or a logic (e.g., binary "0" data state) without first implementing a "clear" operation. The semiconductor memory device 10 may employ any of the exemplary writing, refreshing, holding, and/or reading techniques described herein.

The memory cells 12 may comprise N-type, P-type and/or both types of transistors. Circuitry that is peripheral to the memory array 20 (for example, sense amplifiers or comparators, row and column address decoders, as well as line drivers (not illustrated herein)) may also include P-type and/or N-type transistors. Regardless of whether P-type or N-type transistors are employed in memory cells 12 in the memory array 20, suitable voltage potentials (for example, positive or negative voltage potentials) for reading from and/or writing to the memory cells 12 may be applied.

Figure 2:
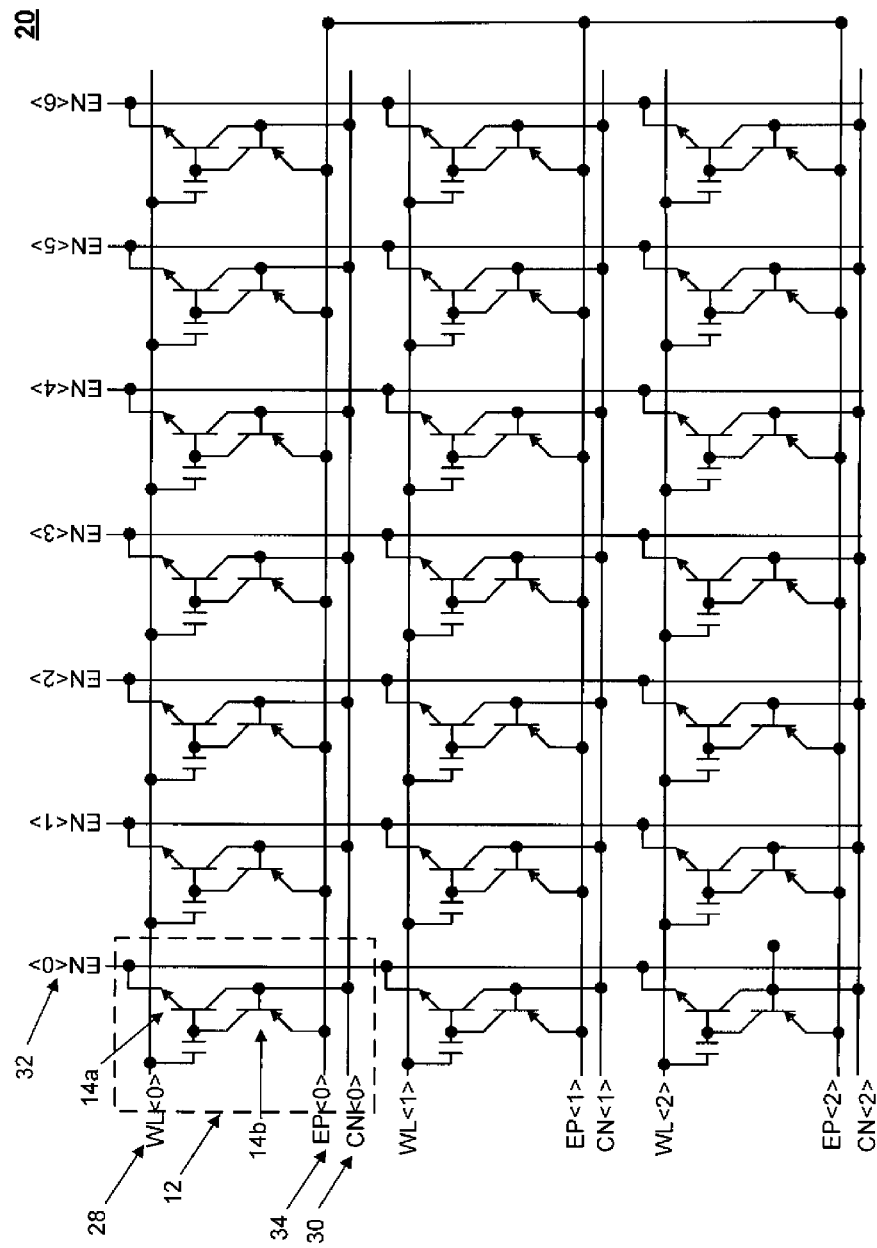
FIG. 2 shows a schematic diagram of at least a portion of a memory cell array having a plurality of memory cells in accordance with an embodiment of the present disclosure.

Referring to FIG. 2, there is shown a schematic diagram of at least a portion of the memory cell array 20 having the plurality of memory cells 12 in accordance with an embodiment of the present disclosure. Each of the memory cells 12 may comprise a first bipolar transistor 14a and a second bipolar transistor 14b coupled to each other. For example, the first bipolar transistor 14a and/or the second bipolar transistor 14b may be an NPN bipolar transistor or a PNP bipolar transistor. As illustrated in FIG. 2, the first bipolar transistor 14a may be an NPN bipolar transistor and the second bipolar transistor 14b may be a PNP bipolar transistor. In another exemplary embodiment, the first memory transistor 14a may be a PNP bipolar transistor and the second memory transistor 14b may be an NPN bipolar transistor.

Each memory cell 12 may be coupled to a respective word line (WL) 28, a respective source line (CN) 30, a respective bit line (EN) 32, and a respective carrier injection line (EP) 34. Data may be written to or read from a selected memory cell 12 by applying suitable control signals to a selected word line (WL) 28, a selected source line (CN) 30, a selected bit line (EN) 32, and/or a selected carrier injection line (EP) 34. In an exemplary embodiment, each word line (WL) 28, source line (CN) 30, and carrier injection line (EP) 34 may extend horizontally parallel to each other in a row direction. Each bit line (EN) 32 may extend vertically in a column direction perpendicular to each word line (WL) 28, source line (CN) 30, and/or carrier injection line (EP) 34.

In an exemplary embodiment, one or more respective bit lines (EN) 32 may be coupled to one or more data sense amplifiers (not shown) of the data write and sense circuitry 36 to read data states of one or more memory cells 12 in the column direction. A data state may be read from one or more selected memory cells 12 by applying one or more control signals to the one or more selected memory cells 12 via a selected word line (WL) 28, a selected source line (CN) 30, and/or a selected carrier injection line (EP) 34 in order to generate a voltage potential and/or a current in the one or more selected memory cells 12. The generated voltage potential and/or current may then be output to the data write and sense circuitry 36 via a corresponding bit line (EN) 32 in order to read a data state stored in each selected memory cell 12.

In an exemplary embodiment, a data state may be read from a selected memory cell 12 via a selected bit line (EN) 32 coupled to the data sense amplifier of the data write and sense circuitry 36. The source line (CN) 30 may be separately controlled via a voltage potential/current source (e.g., a voltage potential/current driver) of the memory cell selection and control circuitry 38. In an exemplary embodiment, the data sense amplifier of the data write and sense circuitry 36 and the voltage potential/current source of the memory cell selection and control circuitry 38 may be configured on opposite sides of the memory cell array 20.

In an exemplary embodiment, a data state may be written to one or more selected memory cells 12 by applying one or more control signals to the one or more selected memory cells 12 via a selected word line (WL) 28, a selected source line (CN) 30, a selected bit line (EN) 32, and/or a selected carrier injection line (EP) 34. The one or more control signals applied to the one or more selected memory cells 12 via a selected word line (WL) 28, a selected source line (CN) 30, a selected bit line (EN) 32, and/or a selected carrier injection line (EP) 34 may control the first bipolar transistor 14a and/or the second bipolar transistor 14b of each selected memory cell 12 in order to write a desired data state to each selected memory cell 12.

The carrier injection lines (EP) 34 corresponding to different rows of the memory cell array 20 may be coupled to each other. In an exemplary embodiment, the carrier injection lines (EP) 34 (e.g., EP<0>, EP<1>, and EP<2>) of the memory cell array 20 may be coupled together and driven by subcircuits of the memory cell selection and control circuitry 38 (e.g., driver, inverter, and/or logic circuits). The subcircuits coupled to each carrier injection line (EP) 34 may be independent voltage drivers located within and/or integrated with the memory cell selection and control circuitry 38. To reduce an amount of area required by the subcircuits of the memory cell selection and control circuitry 38, a plurality of carrier injection lines (EP) 34 of the memory cell array 20 may be coupled to a single subcircuit within the memory cell selection and control circuitry 38. In an exemplary embodiment, the subcircuits of the memory cell selection and control circuitry 38 may bias a plurality of carrier injection lines (EP) 34 coupled together to different voltage potentials and/or current levels (e.g., 0V, 1.0V, etc).

As illustrated in FIG. 2, three rows of carrier injection lines (EP) 34 may be coupled together, however, it may be appreciated by one skilled in the art that the number of rows of carrier injection lines (EP) 34 coupled together within the memory cell array 20 may vary. For example, four rows of carrier injection lines (EP) 34, sixteen rows of carrier injection lines (EP) 34, thirty-two rows of carrier injection lines (EP) 34, and/or sixty-four rows of carrier injection lines (EP) 34 may be coupled together.

Figure 3:
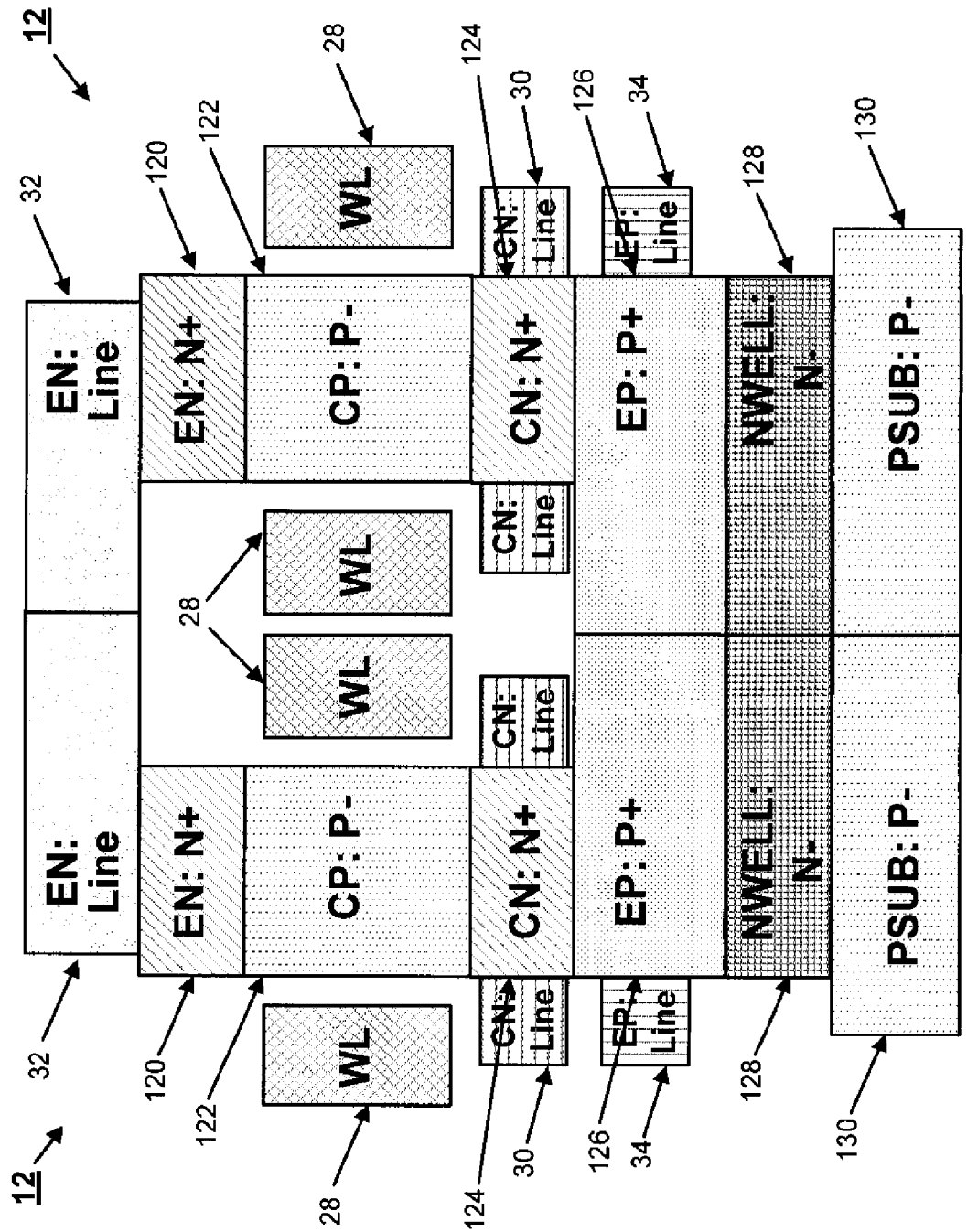
FIG. 3 shows a cross-sectional view of two memory cells along a column direction of a memory cell array in accordance with an embodiment of the present disclosure.

Referring to FIG. 3, there is shown a cross-sectional view of two memory cells 12 along a column direction of the memory cell array 20 shown in FIG. 1 in accordance with an embodiment of the present disclosure. As discussed above, each memory cell 12 may comprise two bipolar transistors. In an exemplary embodiment, the first bipolar transistor 14a may be an NPN bipolar transistor and the second bipolar transistor 14b may be a PNP bipolar transistor. In an exemplary embodiment, the first bipolar transistor 14a and the second bipolar transistor 14b may share one or more common regions. The first bipolar transistor 14a may comprise an N+ emitter region 120, a P− base region 122, and an N+ collector region 124. The second bipolar transistor 14b may comprise the P− collector region 122, the N+ base region 124, and a P+ emitter region 126. The N+ region 120, the P− region 122, the N+ region 124, and/or the P+ region 126 may be disposed in a sequential contiguous relationship within a pillar or fin configuration that may extend vertically from and/or perpendicularly to a plane defined by an N-well region 128 and/or an P− substrate 130. In an exemplary embodiment, the P− region 122 may be an electrically floating body region of the memory cell 12 configured to accumulate/store charges, and may be spaced apart from and capacitively coupled to the word line (WL) 28.

As shown in FIG. 3, the N+ emitter region 120 of the first bipolar transistor 14a may be coupled to a corresponding bit line (EN) 32. In an exemplary embodiment, the N+ emitter region 120 of the first bipolar transistor 14a may be formed of a semiconductor material (e.g., silicon) comprising donor impurities and coupled to the bit line (EN) 32. For example, the N+ emitter region 120 may be formed of a silicon material doped with phosphorus or arsenic impurities. In an exemplary embodiment, the bit line (EN) 32 may be formed of a metal material. In another exemplary embodiment, the bit line (EN) 32 may be formed of a polycide material (e.g., a combination of a metal material and a silicon material). The bit line (EN) 32 may provide a means for accessing one or more selected memory cells 12 on a selected row.

As also shown in FIG. 3, the P− base region 122 of the first bipolar transistor 14a or the P− collector region 122 of the second bipolar transistor 14b may be capacitively coupled to a corresponding word line (WL) 28. In an exemplary embodiment, the P− region 122 may be formed of a semiconductor material (e.g., silicon) comprising acceptor impurities. For example, the P− region 122 may be formed of a silicon material doped with boron impurities. The P− region 122 and the word line (WL) 28 may be capacitively coupled via an insulating or dielectric material. In an exemplary embodiment, the word line (WL) 28 may be formed of a polycide material or a metal material. In an exemplary embodiment, the word line (WL) 28 may extend in a row direction of the memory cell array 20.

As further shown in FIG. 3, the N+ region 124 of the memory cell 12 may be coupled to a source line (CN) 30. In an exemplary embodiment, the N+ region 124 may be formed of a semiconductor material (e.g., silicon) comprising donor impurities. For example, the N+ region 124 may be formed of a silicon material doped with phosphorus or arsenic impurities. In an exemplary embodiment, the source line (CN) 30 may be formed of a polycide material. In another exemplary embodiment, the source line (CN) 30 may be formed of a metal material. The source line (CN) 30 may circumferentially surround the N+ region 124 of the memory cell 12. As such, the source line (CN) 30 may reduce a disturbance to the memory cell 12. For example, the source line (CN) 30 may be formed of a metal material and reduce a hole disturbance in the memory cell 12. The source line (CN) 30 may extend horizontally in a row direction parallel to the word line (WL) 28 and/or the carrier injection line (EP) 34, and may be coupled to a plurality of memory cells 12 (e.g., a row of memory cells 12). For example, the source line (CN) 30, the word line (WL) 28, and/or the carrier injection line (EP) 34 may be arranged in different planes and configured to be parallel to each other. In an exemplary embodiment, the source line (CN) 30 may be arranged in a plane between a plane containing the word line (WL) 28 and a plane containing the carrier injection line (EP) 34.

As further shown in FIG. 3, the P+ emitter region 126 of the second bipolar transistor 14a may be coupled to the carrier injection line (EP) 34. The P+ region 126 may be formed of a semiconductor material (e.g., silicon) comprising acceptor impurities and directly coupled to the carrier injection line (EP) 34. For example, the P+ region 126 may be formed of a silicon material doped with boron impurities. In an exemplary embodiment, the P+ region 126 may be configured as an input region for charges to be stored in the P− region 122 of the memory cell 12. The charges to be stored in the P− region 122 of the memory cell 12 may be supplied by the carrier injection line (EP) 34 and input into the P− region 122 via the N+ region 124 and/or the P+ region 126.

The carrier injection line (EP) 34 may be formed of a polycide material or a metal material. In an exemplary embodiment, the carrier injection line (EP) 34 may extend in a row direction of the memory cell array 20. For example, the carrier injection line (EP) 34 may extend horizontally in parallel to the word line (WL) 28 and/or the source line (CN) 30, and may be coupled to a plurality of memory cells 12 (e.g., a row of memory cells 12). For example, the carrier injection line (EP) 34, the word line (WL) 28, and/or the source line (CN) may be arranged in different planes and configured to be parallel to each other. In an exemplary embodiment, the carrier injection line (EP) 34 may be arranged in a plane below a plane containing the word line (WL) 28 and a plane containing the carrier injection line (EP) 34.

As discussed above, carrier injection lines (EP) 34 corresponding to different rows of the memory cell array 20 may be coupled to each other in order to bias and/or access memory cells 12 in different rows of the memory cell array 20. Thus, in an exemplary embodiment, P+ regions 126 of memory cells 12 in different rows of memory cell array 20 may be coupled to each other by coupling the carrier injection lines (EP) 34 corresponding to different rows of the memory cell array 20. In another exemplary embodiment, carrier injection lines (EP) 34 corresponding to different rows of the memory cell array 20 may be coupled to each other via a carrier injection line plate, a carrier injection line grid, or a combination of a carrier injection line plate and a carrier injection line grid.

As further shown in FIG. 3, the N-well region 128 may be disposed between the P+ region 126 and the P− substrate 130. The N-well region 128 may be formed of a semiconductor material (e.g., silicon) comprising donor impurities and extend in a planar direction parallel to the P− substrate 130. For example, the N-well region 128 may be formed of a silicon material doped with phosphorus or arsenic impurities. In an exemplary embodiment, the N-well region 128 may comprise a strip protruding portion corresponding to each row of the memory cell array 20. For example, the strip protruding portion of the N-well region 128 may be configured to accommodate a row of memory cells 12 of the memory cell array 20.

In an exemplary embodiment, the P− substrate 130 may be made of a semiconductor material (e.g., silicon) comprising acceptor impurities and may form a base of the memory cell array 20. For example, the P− substrate 130 may be formed of a silicon material doped with boron impurities. In alternative exemplary embodiments, a plurality of P− substrates 130 may form a base of the memory cell array 20 or a single P− substrate 130 may form the base of the memory cell array 20. Also, the P− substrate 130 may be made in the form of a P-well substrate.

Figure 4:
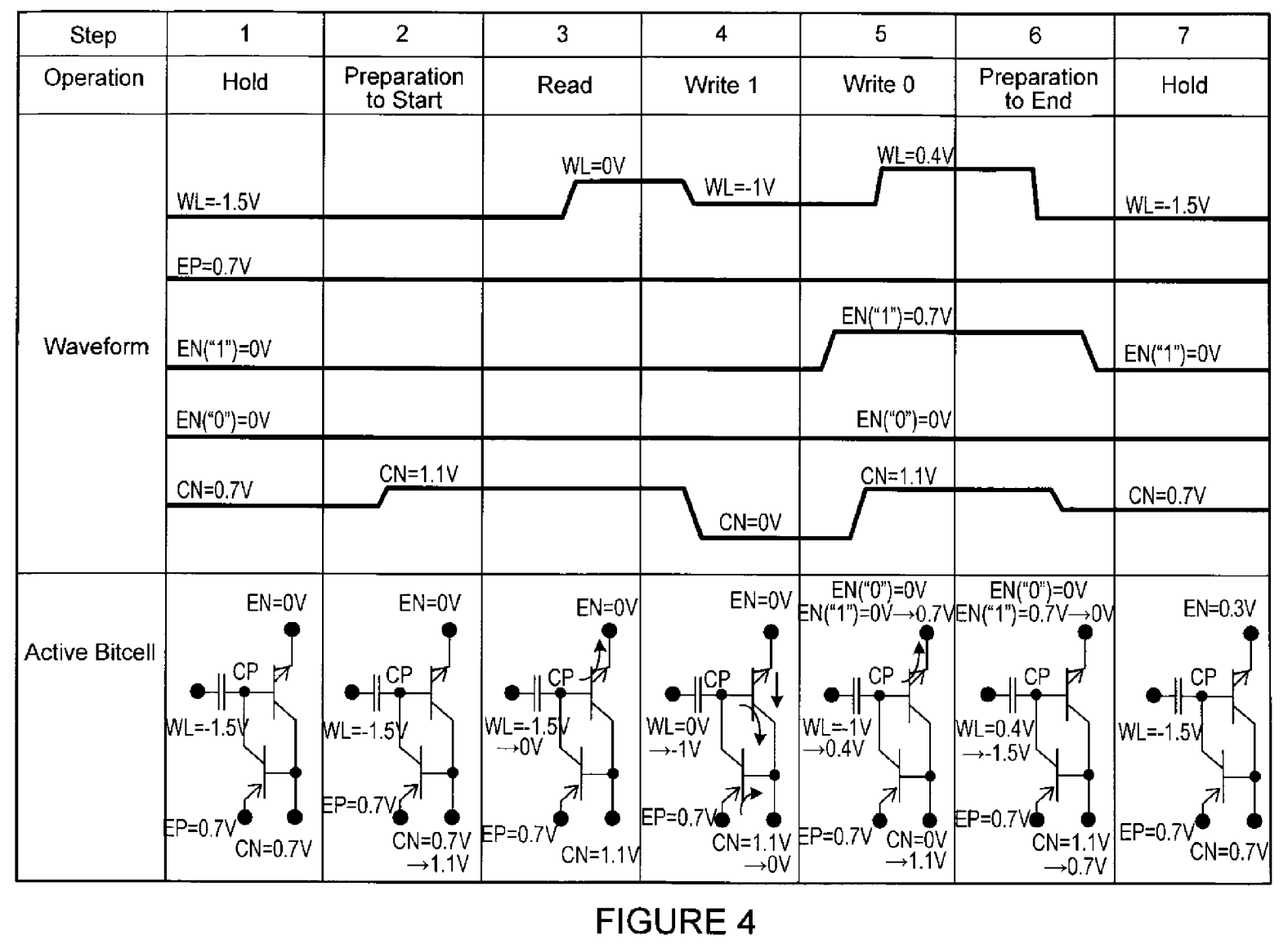

Referring to FIG. 4, there are shown control signal voltage waveforms for performing a refresh operation on a memory cell in accordance with an embodiment of the present disclosure. The refresh operation may include control signals configured to perform one or more sub-operations. In an exemplary embodiment, the refresh operation may include a preparation to start operation, a read operation, a write logic high (e.g., binary "1" data state) operation, a write logic low (e.g., binary "0" data state) operation, and/or a preparation to end operation.

Prior to performing a refresh operation, the control signals may be configured to perform a hold operation in order to maintain a data state (e.g., a logic high (binary "1" data state) or a logic low (e.g., binary "0" data state)) stored in the memory cell 12. In particular, the control signals may be configured to perform a hold operation in order to maximize a retention time of a data state (e.g., a logic low (binary "0" data state) and/or a logic high (e.g., binary "1" data state)) stored in the memory cell 12. Also, the control signals for the hold operation may be configured to eliminate or reduce activities or fields (e.g., electrical fields between junctions which may lead to leakage of charges) within the memory cell 12.

In an exemplary embodiment, during a hold operation, a negative voltage potential may be applied to the word line (WL) 28 that may be capacitively coupled to the P− region 122 of the memory cell 12, while voltage potentials applied to other regions (e.g., the N+ region 120, the N+ region 124, and/or the P+ region 126) may be maintained at approximately 0V or higher. For example, the negative voltage potential applied to the word line (WL) 28 (e.g., capacitively coupled to the P− region 122 of the memory cell 12) may be −1.5V. The voltage potential applied to the bit line (EN) 32 may be maintained at approximately 0V. The voltage potentials applied to the source line (CN) 30 and/or the carrier injection line (EP) 34 may be maintained at approximately 0.7V. During the hold operation, the junction between the N+ region 124 and the P− region 122 and the junction between the N+ region 120 and the P− region 122 may be reverse biased in order to retain a data state (e.g., a logic high (binary "1" data state) or a logic low (binary "0" data state)) stored in the memory cell 12.

In an exemplary embodiment, a refresh operation may include control signals to perform a preparation to start operation where the control signals may be applied to a memory cell 12 in order to prepare the memory cell 12 for one or more subsequent operations (e.g., a read operation and/or a write operation). For example, control signals applied to a memory cell 12 may be configured to minimize a time delay between voltage potentials applied to the N+ region 124 of the memory cell 12 and the word line (WL) 28 in order to reduce a disturbance. A leakage of charge carriers from the P− region 122 may result when the preparation to start operation is not performed. For example, when 0V is applied to the bit line (EN) 32, 1.1V is applied to the source line (CN) 30 (at the start of a read operation), and −1.5V is applied to the word line (WL) 28, an electric field may be created across the junction from the P− region 122 and the N+ region 124. The electric field may cause a leakage (e.g., in a logic high (binary "1" data state) or an increase (e.g., in a logic low (binary "0" data state)) of charge carriers stored in the memory cell 12, or band-to-band tunneling (e.g., gate-induced drain leakage "GIDL").

In an exemplary embodiment, control signals applied to a memory cell 12 during the preparation to start operation may be configured to reduce band-to-band tunneling (e.g., gate-induced drain leakage "GIDL"). For example, a positive voltage potential may be applied to the N+ region 124 of the memory cell 12, while voltage potentials applied to other regions (e.g., the N+ region 120, the P− region 122 via capacitive coupling with the word line (WL) 28, and/or the P+ region 126) of the memory cell 12 may be maintained at the same voltage potentials applied during the hold operation. The positive voltage potential applied to the source line (CN) 30 may be raised to 1.1V from 0.7V. The voltage potential applied to the bit line (EN) 32 may be maintained at 0V and the carrier injection line (EP) 34 may be maintained at 0.7V. The voltage potential applied to the word line (WL) 28 (e.g., capacitively coupled to the P− region 122) may be maintained at −1.5V.

In an exemplary embodiment, a refresh operation may also include a read operation where the control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (EN) 32. In an exemplary embodiment, a voltage potential applied to the word line (WL) 28 (e.g., capacitively coupled to the P− region 122) and/or a voltage potential applied to the N+ region 124 via the source line (CN) 30 may be raised to a predetermined voltage potential in order to read a data state stored in the memory cell 12. In another exemplary embodiment, in the event that voltage potentials are applied to the memory cell 12 in preparation for the read operation (e.g., in the preparation to start operation as discussed above), the voltage potential applied to the N+ region 124 of the memory cell 12 may remain the same as the voltage potential applied during the preparation to start operation. For example, the voltage potential applied to the word line (WL) 28 (e.g., capacitively coupled to the P− region 122 of the memory cell 12) may be raised to 0V from −1.5V, while the voltage potential applied to the N+ region 124 of the memory cell 12 via the source line (CN) 30 may be raised to or maintained at 1.1V.

In an exemplary embodiment, during the read operation, the voltage potential applied to the word line (WL) 28 (e.g., capacitively coupled to the P− region 122 of the memory cell 12) may be raised to 0V and the voltage potential applied to the source line (ON) 30 may be raised to 1.1V. Under such biasing, the junction between the P− region 122 and the N+ region 120 may become forward biased. Also, under such biasing, the junction between the P− region 122 and the N+ region 124 may be reverse biased or become weakly forward biased (e.g., above a reverse bias voltage and below a forward bias threshold voltage, or a voltage potential at a p-diffusion region between the P− region 122 and the N+ region 124 is higher than the voltage potential at an n-diffusion region between the P− region 122 and the N+ region 124). A voltage potential or current may be generated when forward biasing the junction between the P− region 122 and the N+ region 120. The voltage potential or current generated may be output to a data sense amplifier via the bit line (EN) 32 coupled to the N+ region 120. An amount of voltage potential or current generated may be representative of a data state (e.g., a logic low (binary "0" data state) and/or a logic high (binary "1" data state)) stored in the memory cell 12.

In an exemplary embodiment, when a logic low (e.g., binary "0" data state) is stored in the memory cell 12, the junction between the P− region 122 and the N+ region 120 may remain reverse biased or become weakly forward biased (e.g., above a reverse bias voltage and below a forward bias threshold voltage or a voltage potential at a p-diffusion region between the P− region 122 and the N+ region 124 is higher than a voltage potential at an n-diffusion region between the P− region 122 and the N+ region 124). A small amount of voltage potential and current or no voltage potential and current (e.g., compared to a reference voltage potential or current) may be generated when the junction between the P− region 122 and the N+ region 120 is reverse biased or weakly forward biased. A data sense amplifier in the data write and sense circuitry 36 may detect the small amount of voltage potential or current (e.g., compared to a reference voltage potential or current) or no voltage potential or current via the bit line (EN) 32 coupled to the N+ region 120.

In another exemplary embodiment, when a logic high (e.g., binary "1" data state) is stored in the memory cell 12, the junction between the P− region 122 and the N+ region 120 may be forward biased. A larger amount of voltage potential or current (e.g., compared to a reference voltage potential or current) may be generated when the junction between the P− region 122 and the N+ region 120 is forward biased. A data sense amplifier in the data write and sense circuitry 36 may detect the larger amount of voltage potential or current via the bit line (EN) 32 coupled to the N+ region 120.

In an exemplary embodiment, a refresh operation may also include a write logic high (e.g., binary "1" data state) operation where the control signals may be configured to write a logic high (e.g., binary "1" data state) to one or more selected memory cells 12 of one or more selected rows of the memory cell array 20. For example, the write logic high (e.g., binary "1" data state) operation may be performed on one or more selected rows of the memory cell array 20 or the entire memory cell array and a subsequent write logic low (e.g., binary "0" data state) operation may be performed on one or more selected memory cells 12. In an exemplary embodiment, a voltage potential applied to the N+ region 120 of the memory cell 12 via the bit line (EN) 32 may be maintained at 0V, and a voltage potential applied to the P+ region 126 of the memory cells 12 via the carrier injection line (EP) 34 may be maintained at 0.7V. A voltage potential applied to the word line (WL) 28 (e.g., capacitively coupled to the P− region 122) may be lowered to −1.0V. Simultaneously to or subsequent to lowering a voltage potential applied to the word line (WL) 28, a voltage potential applied to the source line (CN) 30 may be lowered to 0V from 1.1V.

Under such biasing, the junction between the N+ region 120 and the P− region 122 may be reverse biased and the junction between the P+ region 126 and the N+ region 124 may become forward biased. A logic high (e.g., binary "1" data state) may be written to the P− region 122 (e.g., majority charge carriers injected into the P− region 122 from the P+ region 126 via the N+ region 124) via the forward biased junction between the P+ region 126 and the N+ region 124. As more majority charge carriers are accumulated in the P− region 122, a voltage potential at the P− region 122 may increase to approximately 0.7V to 1.0V above a voltage potential at the N+ region 124. At this time, the first bipolar transistor 14a may start to switch to an "ON" state and current generated by the first bipolar transistor 14a may increase the voltage potential at the N+ region 124 due to a resistive voltage potential drop on the source line (CN) 30. The increase of the voltage potential at the N+ region 124 may lead to a decrease of current flow in the second bipolar transistor 14b, which in turn may cause a decrease in a current load on the carrier injection line (EP) 34, thus ending the write logic high (e.g., binary "1" data state) operation.

In an exemplary embodiment, a refresh operation may also include a write logic low (e.g., binary "0" data state) operation where the control signals may be configured to perform one or more write operations to one or more selected memory cells 12. For example, the write logic low (e.g., binary "0" data state) operation may be performed to one or more selected memory cells 12 after a write logic high (e.g., binary "1" data state) operation in order to deplete majority charge carriers that may have accumulated in the P− regions 122 of the one or more selected memory cells 12. In an exemplary embodiment, a voltage potential applied to the N+ region 120 via a corresponding bit line (EN("0")) 32 may be maintained at 0V in order to perform the write logic low (e.g., binary "0" data state) operation. A voltage potential applied to the N+ region 124 via the source line (CN) 30 may be raised to 1.1V from 0V. Subsequent to or simultaneously to raising the voltage potential applied to the N+ region 124 via the source line (CN) 30, a voltage potential applied to the word line (WL) 28 may be raised to approximately 0.4V from −1.0V.

Under such biasing, the junction between the N+ region 120 and the P− region 122 may become forward biased and the first bipolar transistor 14a (e.g., regions 120-124) may be switched to an "ON" state. The majority charge carriers that may have accumulated in the P− region 122 during the write logic high (e.g., binary "1" data state) operation may be removed via the forward biased junction between the N+ region 120 and the P− region 122. By removing the majority charge carriers that may have accumulated in the P− region 122, a logic low (e.g., binary "0" data state) may be written to the memory cell 12.

In order to maintain a logic high (e.g., binary "1" data state) in one or more unselected memory cells 12 during the write logic low (e.g., binary "0" data state) operation, a masking operation may be performed on the one or more unselected memory cells 12. For example, the voltage potential applied to the N+ region 120 of the one or more unselected memory cells 12 via a corresponding bit line (EN("1")) 32 may be raised to 0.7V or higher (e.g., 1.2V) in order to prevent the depletion of majority charge carriers that may have accumulated in the P− region 122. Under such biasing, the junction between the N+ region 120 and the P− region 122 may not be forward biased and the junction between the P− region 122 and the N+ region 124 may not be forward biased, thereby preventing the depletion of majority charge carriers accumulated in the P− region 122 and the logic high (e.g., binary "1" data state) may be maintained in the memory cell 12.

In an exemplary embodiment, a refresh operation may also include a preparation to end operation. During the preparation to end operation, the voltage potentials applied to the memory cells 12 may adjust an amount of majority charge carriers or data states stored in the P− regions 122 of the memory cells 12. A voltage potential applied to the word line (WL) 28 (e.g., capacitively coupled to the P− region 122) may be lowered to −1.1V from 0.4V and may determine an amount of majority charge carriers or data states stored in the P− regions 122 of the memory cells 12. Also, voltage potentials applied to the N+ regions 124 and the P+ regions 126 may be lowered to and/or maintained at 0.7V in order to maintain data states stored in the memory cells 12. Further, a voltage potential applied to the N+ regions 120 of the memory cells 12 that may store a logic low (e.g., binary "0" data state) may be maintained at 0V. In contrast, a voltage potential applied to the N+ regions 120 of the memory cells 12 that may store a logic high (e.g., binary "1" data state) may be lowered to 0V from 0.7V during a masking operation.

Referring to FIG. 5, there are shown control signal voltage waveforms for performing a masking operation on one or more unselected memory cells 12 along an active row to reduce a disturbance during active operations in accordance with an embodiment of the present disclosure. For example, during one or more active operations (e.g., read operation, write operation, sense operation, preparation to start/end operation, and/or refresh operation), voltage potentials may be applied to every memory cell 12 along an active row via a corresponding word line (WL) 28, a corresponding source line (CN) 30, and/or a corresponding carrier injection line (EP) 34. However, while the active operations may be performed on one or more selected memory cells 12 along the active row, one or more unselected memory cells 12 along the active row may experience a disturbance caused by the voltage potentials applied via the corresponding word line (WL) 28, the corresponding source line (CN) 30, and/or the corresponding carrier injection line (EP) 34 during the active operations. In order to reduce a disturbance experienced by the one or more unselected memory cells 12 along the active row, a masking operation may be performed on the one or more unselected memory cells 12.

In an exemplary embodiment, during a masking operation, a voltage potential may be applied to the one or more unselected memory cells 12 on the active row via a corresponding bit line (EN("Mask")) 32. The voltage potential applied via the corresponding bit line (EN("Mask")) 32 to the one or more unselected memory cells 12 on the active row may be raised to a predetermined voltage potential. In an exemplary embodiment, the voltage potential applied to the corresponding bit line (EN("Mask")) 32 associated with the one or more unselected memory cells 12 along the active row may be 0.7V in order to reduce a disturbance caused by the active operations.

Figure 6:
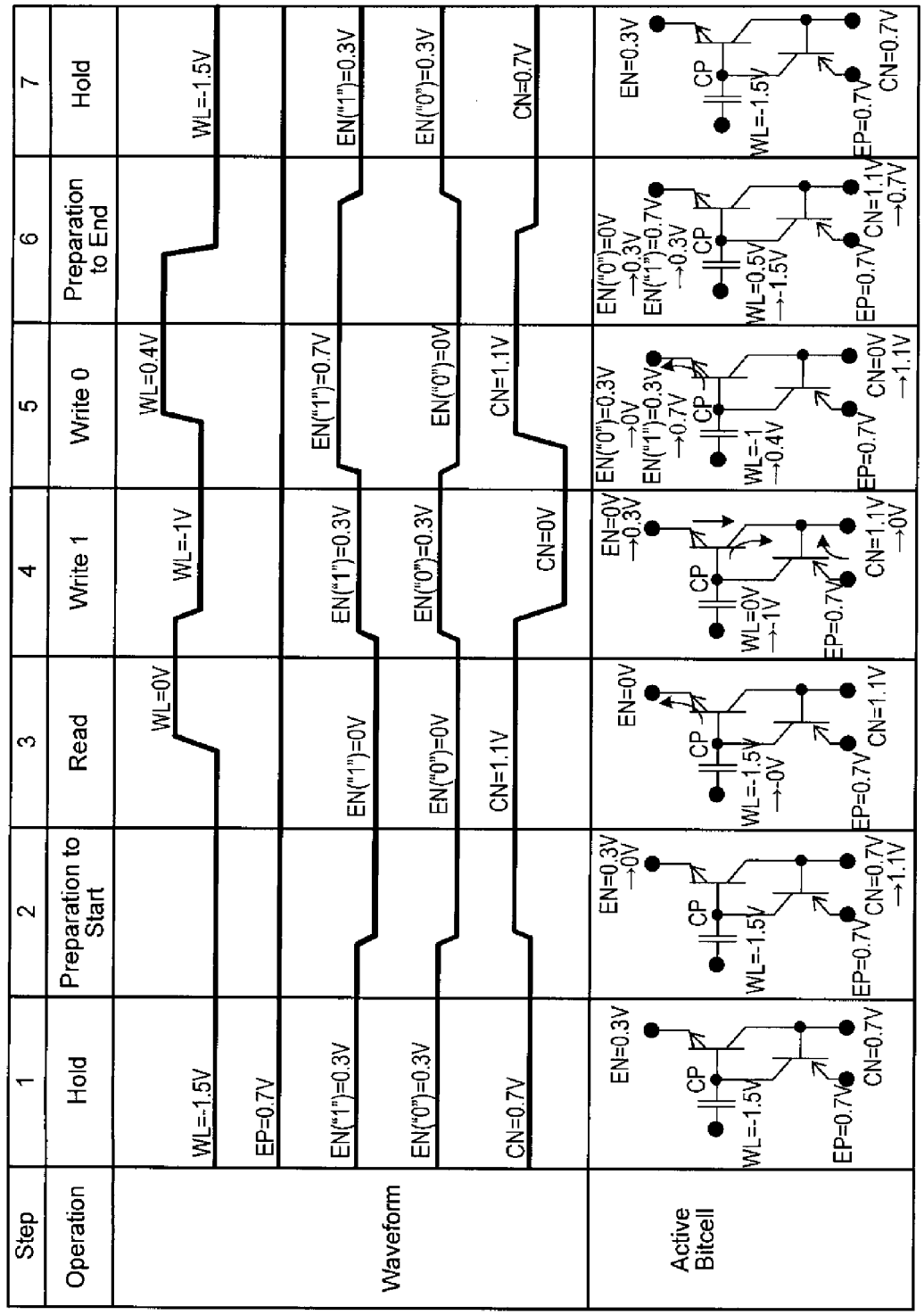
FIG. 6 shows control signal voltage waveforms for performing a refresh operation on a memory cell in accordance with an alternative embodiment of the present disclosure.

FIG. 6 shows control signal voltage waveforms for performing a refresh operation on a memory cell in accordance with an alternative embodiment of the present disclosure. The refresh operation may include control signals configured to perform one or more sub-operations. In an exemplary embodiment, the refresh operation may include a preparation to start operation, a read operation, a write logic high (e.g., binary "1" data state) operation, a write logic low (e.g., binary "0" data state) operation, and/or preparation to end operation.

Prior to performing a refresh operation, the control signals may be configured to perform a hold operation in order to maintain a data state (e.g., a logic high (binary "1" data state) or a logic low (e.g., binary "0" data state)) stored in the memory cell 12. In particular, the control signals may be configured to perform a hold operation in order to maximize a retention time of a data state (e.g., a logic low (binary "0" data state) and/or a logic high (e.g., binary "1" data state)) stored in the memory cell 12. Also, the control signals for the hold operation may be configured to eliminate or reduce activities or fields (e.g., electrical fields between junctions which may lead to leakage of charges) within the memory cell 12.

In an exemplary embodiment, during a hold operation, a negative voltage potential may be applied to the word line (WL) 28 that may be capacitively coupled to the P− region 122 of the memory cell 12, while voltage potentials applied to other regions (e.g., the N+ region 120, the N+ region 124, and/or the P+ region 126) may be maintained above 0V. For example, the negative voltage potential applied to the word line (WL) 28 (e.g., capacitively coupled to the P− region 122 of the memory cell 12) may be −1.5V. The voltage potential applied to the bit line (EN) 32 may be maintained at approximately 0.3V. The voltage potentials applied to the source line (CN) 30 and/or the carrier injection line (EP) 34 may be maintained at approximately 0.7V. During the hold operation, the junction between the N+ region 124 and the P− region 122 and the junction between the N+ region 120 and the P− region 122 may be reverse biased in order to retain a data state (e.g., a logic high (binary "1" data state) or a logic low (binary "0" data state)) stored in the memory cell 12.

In an exemplary embodiment, a refresh operation may include control signals to perform a preparation to start operation where the control signals may be applied to a memory cell 12 in order to prepare the memory cell 12 for one or more subsequent operations (e.g., a read operation and/or a write operation). For example, control signals applied to a memory cell 12 may be configured to minimize a time delay between voltage potentials applied to the N+ region 124 of the memory cell 12 and the word line (WL) 28 in order to reduce a disturbance. A leakage of charge carriers from the P− region 122 may result when the preparation to start operation is not performed. For example, when 0V is applied to the bit line (EN) 32, 1.1V is applied to the source line (CN) 30 (at the start of a read operation), and −1.5V is applied to the word line (WL) 28, an electric field may be created across the junction from the P− region 122 and the N+ region 124. The electric field may cause a leakage (e.g., in a logic high (binary "1" data state) or an increase (e.g., in a logic low (binary "0" data state)) of charge carriers stored in the memory cell 12, or band-to-band tunneling (e.g., gate-induced drain leakage "GIDL").

In an exemplary embodiment, control signals applied to a memory cell 12 during the preparation to start operation may be configured to reduce band-to-band tunneling (e.g., gate-induced drain leakage "GIDL"). For example, a positive voltage potential may be applied to the N+ region 124 of the memory cell 12, while voltage potential applied to the N+ region 120 may be lowered. The voltage potentials applied to other regions (e.g., the P− region 122 via capacitive coupling with the word line (WL) 28 and/or the P+ region 126) of the memory cell 12 may be maintained at the same voltage potentials applied during the hold operation. The positive voltage potential applied to the source line (CN) 30 may be raised to 1.1V from 0.7V. The voltage potential applied to the bit line (EN) 32 may be lowered to 0V from 0.3V. The voltage potential applied to the carrier injection line (EP) 34 may be maintained at 0.7V and the voltage potential applied to the word line (WL) 28 (e.g., capacitively coupled to the P− region 122) may be maintained at −1.5V.

In an exemplary embodiment, a refresh operation may also include a read operation where the control signals may be configured to read a data state (e.g., a logic low (binary "0" data state) and/or a logic high (binary "1" data state)) stored in one or more selected memory cells 12 of one or more selected rows of the memory cell array 20. The control signals may be configured to a predetermined voltage potential to implement a read operation via the bit line (EN) 32. In an exemplary embodiment, a voltage potential applied to the word line (WL) 28 (e.g., capacitively coupled to the P− region 122) and/or a voltage potential applied to the N+ region 124 via the source line (CN) 30 may be raised to a predetermined voltage potential. The voltage potential applied to the N+ region 120 via the bit line (EN) 32 may be lowered to a predetermined voltage potential in order to read a data state stored in the memory cell 12. In another exemplary embodiment, in the event that voltage potentials are applied to the memory cell 12 in preparation for the read operation (e.g., in the preparation to start operation as discussed above), the voltage potentials applied to the N+ region 120 and the N+ region 124 of the memory cell 12 may remain the same as the voltage potential applied during the preparation to start operation. For example, the voltage potential applied to the word line (WL) 28 (e.g., capacitively coupled to the P− region 122 of the memory cell 12) may be raised to 0V from −1.5V. The voltage potential applied to the N+ region 120 of the memory cell 12 via the bit line (EN) 32 may be lowered to or maintained at 0V. The voltage potential applied to the N+ region 124 via the source line (CN) 30 of the memory cell 12 may be raised to or maintained at 1.1V.

In an exemplary embodiment, during the read operation, the voltage potential applied to the word line (WL) 28 (e.g., capacitively coupled to the P− region 122 of the memory cell 12) may be raised to 0V. The voltage potential applied to the source line (CN) 30 may be raised to 1.1V and the voltage potential applied to the bit line (EN) 32 may be lowered to 0V. Under such biasing, the junction between the P− region 122 and the N+ region 120 may become forward biased. Also, under such biasing, the junction between the P− region 122 and the N+ region 124 may be reverse biased or become weakly forward biased (e.g., above a reverse bias voltage and below a forward bias threshold voltage, or a voltage potential at a p-diffusion region between the P− region 122 and the N+ region 124 is higher than a voltage potential at an n-diffusion region between the P− region 122 and the N+ region 124). A voltage potential or current may be generated when forward biasing the junction between the P− region 122 and the N+ region 120. The voltage potential or current generated may be output to a data sense amplifier via the bit line (EN) 32 coupled to the N+ region 120. An amount of voltage potential or current generated may be representative of a data state (e.g., a logic low (binary "0" data state) and/or a logic high (binary "1" data state)) stored in the memory cell 12.

In an exemplary embodiment, when a logic low (e.g., binary "0" data state) is stored in the memory cell 12, the junction between the P− region 122 and the N+ region 120 may remain reverse biased or become weakly forward biased (e.g., above a reverse bias voltage and below a forward bias threshold voltage, or a voltage potential at a p-diffusion region between the P− region 122 and the N+ region 124 is higher than a voltage potential at an n-diffusion region between the P− region 122 and the N+ region 124). A small amount of voltage potential and current (e.g., compared to a reference voltage potential or current) or no voltage potential and current may be generated when the junction between the P− region 122 and the N+ region 120 is reverse biased or weakly forward biased. A data sense amplifier in the data write and sense circuitry 36 may detect the small amount of voltage potential or current (e.g., compared to a reference voltage potential or current) or no voltage potential or current via the bit line (EN) 32 coupled to the N+ region 120.

In another exemplary embodiment, when a logic high (e.g., binary "1" data state) is stored in the memory cell 12, the junction between the P− region 122 and the N+ region 120 may be forward biased. A larger amount of voltage potential or current (e.g., compared to a reference voltage potential or current) may be generated when the junction between the P− region 122 and the N+ region 120 is forward biased. A data sense amplifier in the data write and sense circuitry 36 may detect the larger amount of voltage potential or current via the bit line (EN) 32 coupled to the N+ region 120.

In an exemplary embodiment, a refresh operation may also include a write logic high (e.g., binary "1" data state) operation where the control signals may be configured to write a logic high (e.g., binary "1" data state) to one or more selected memory cells 12 of one or more selected rows of the memory cell array 20. For example, the write logic high (e.g., binary "1" data state) operation may be performed on one or more selected rows of the memory cell array 20 or the entire memory cell array and a subsequent write logic low (e.g., binary "0" data state) operation may be performed on one or more selected memory cells 12. In an exemplary embodiment, a voltage potential applied to the P+ region 126 of the memory cells 12 via the carrier injection line (EP) 34 may be maintained at 0.7V. A voltage potential applied to the N+ region 120 of the memory cell 12 via the bit line (EN) 32 may be raised to 0.3V. Simultaneously to or subsequent to raising a voltage potential applied to the bit line (EN) 32, the voltage potential applied to the word line (WL) 28 (e.g., capacitively coupled to the P− region 122) may be lowered to −1.0V and a voltage potential applied to the source line (CN) 30 may be lowered to 0V from 1.1V.

Under such biasing, the junction between the N+ region 120 and the P− region 122 may be reverse biased and the junction between the P+ region 126 and the N+ region 124 may become forward biased. A logic high (e.g., binary "1" data state) may be written to the P− region 122 (e.g., majority charge carriers injected into the P− region 122 from the P+ region 126 via the N+ region 124) via the forward biased junction between the P+ region 126 and the N+ region 124. As more majority charge carriers are accumulated in the P− region 122, a voltage potential at the P− region 122 may increase to approximately 0.7V to 1.0V above a voltage potential at the N+ region 124. At this time, the first bipolar transistor 14a may start to switch to an "ON" state and current generated by the first bipolar transistor 14a may increase the voltage potential at the N+ region 124 due to a resistive voltage potential drop on the source line (CN) 30. The increase of the voltage potential at N+ the region 124 may lead to a decrease of current flow in the second bipolar transistor 14b, which in turn may cause a decrease in a current load on the carrier injection line (EP) 34, thus ending the write logic high (e.g., binary "1" data state) operation.

In an exemplary embodiment, a refresh operation may also include a write logic low (e.g., binary "0" data state) operation where the control signals may be configured to perform one or more write operations to one or more selected memory cells 12. For example, the write logic low (e.g., binary "0" data state) operation may be performed to one or more selected memory cells 12 after a write logic high (e.g., binary "1" data state) operation in order to deplete majority charge carriers that may have accumulated in the P− regions 122 of the one or more selected memory cells 12. In an exemplary embodiment, a voltage potential applied to the N+ region 120 via a corresponding bit line (EN("0")) 32 may be lowered to approximately 0V from 0.3V in order to perform the write logic low (e.g., binary "0" data state) operation. A voltage potential applied to the N+ region 124 via the source line (CN) may be raised to 1.1V from 0V. Subsequent to or simultaneously to lowering the voltage potential applied to the N+ region 120 via the corresponding bit line (EN("0")) 32 and/or raising the voltage potential applied to the N+ region 124 via the source line (CN) 30, a voltage potential applied to the word line (WL) 28 may be raised to approximately 0.4V from −1.0V.

Under such biasing, the junction between the N+ region 120 and the P− region 122 may become forward biased and the first bipolar transistor 14a (e.g., regions 120-124) may be switched to an "ON" state. The majority charge carriers that may have accumulated in the P− region 122 during the write logic high (e.g., binary "1" data state) operation may be removed via the forward biased junction between the N+ region 120 and the P− region 122. By removing the majority charge carriers that may have accumulated in the P− region 122, a logic low (e.g., binary "0" data state) may be written to the memory cell 12.

In order to maintain a logic high (e.g., binary "1" data state) in one or more unselected memory cells 12 during the write logic low (e.g., binary "0" data state) operation, a masking operation may be performed on the one or more unselected memory cells 12. For example, the voltage potential applied to the N+ region 120 via a corresponding bit line (EN("1")) 32 of the one or more unselected memory cells 12 may be raised to 0.7V or higher (e.g., 1.2V) in order to prevent the depletion of majority charge carriers that may have accumulated in the P− region 122. Under such biasing, the junction between the N+ region 120 and the P− region 122 may not be forward biased and the junction between the P− region 122 and the N+ region 124 may not be forward biased in order to prevent the depletion of majority charge carriers accumulated in the P− region 122 and the logic high (e.g., binary "1" data state) may be maintained in the memory cell 12.

In an exemplary embodiment, a refresh operation may also include a preparation to end operation. During the preparation to end operation, the voltage potentials applied to the memory cells 12 may adjust an amount of majority charge carriers or data states stored in the P− regions 122 of the memory cells 12. A voltage potential applied to the word line (WL) 28 (e.g., capacitively coupled to the P− region 122) may be lowered to −1.5V from 0.4V and may determine an amount of majority charge carriers or data states stored in the P− regions 122 of the memory cells 12. Also, voltage potentials applied to the N+ regions 124 and the P+ regions 126 may be lowered to and/or maintained at 0.7V in order to maintain data states stored in the memory cells 12. Further, a voltage potential applied to the N+ regions 120 of the memory cells 12 that may store a logic low (e.g., binary "0" data state) may be raised to 0.3V. In contrast, a voltage potential applied to the N+ regions 120 of the memory cells 12 that may store a logic high (e.g., binary "1" data state) may be lowered to 0.3V from 0.7V during a masking operation.

Figure 7:
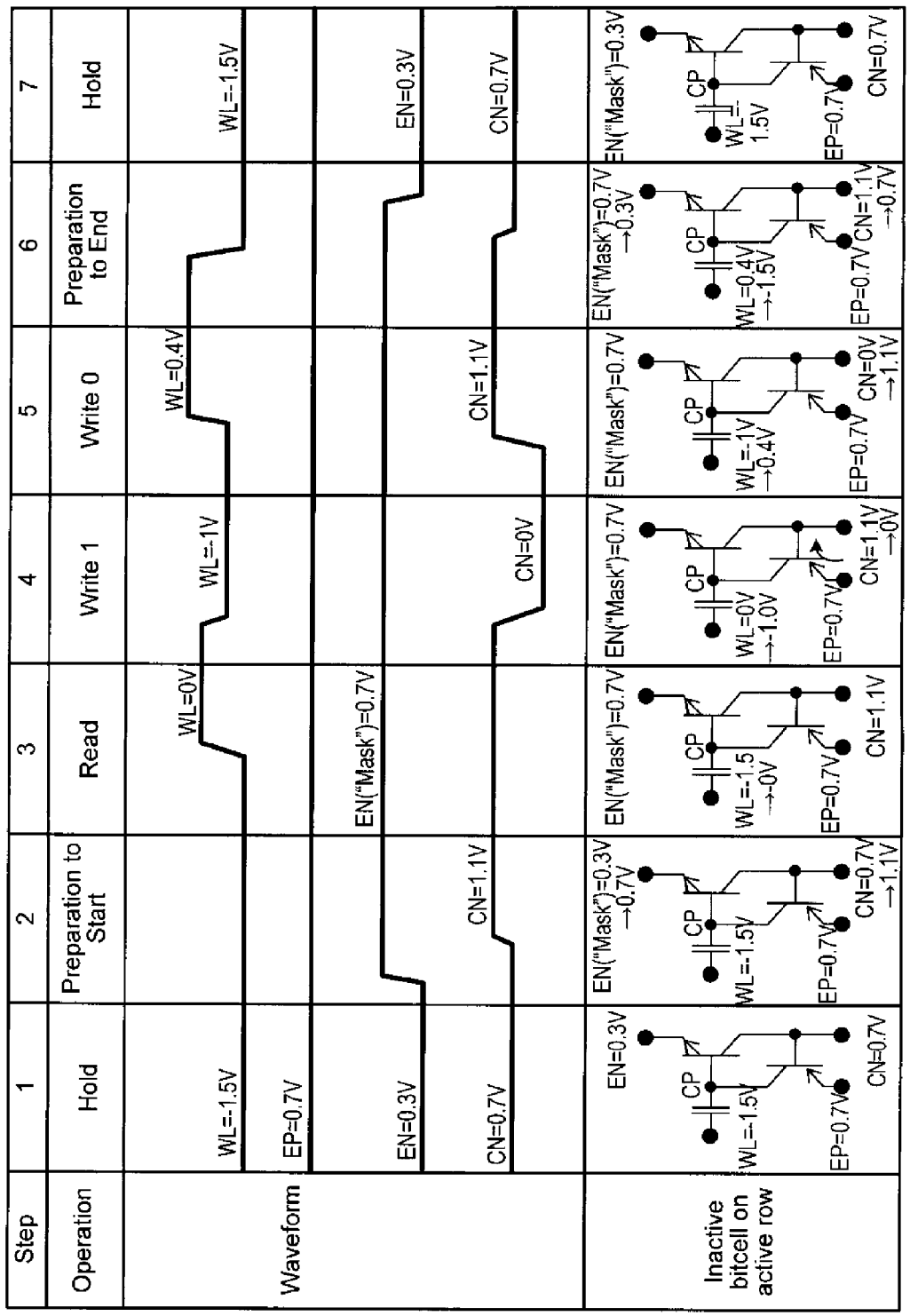
FIG. 7 shows control signal voltage waveforms for performing a masking operation on one or more unselected memory cells along an active row to reduce a disturbance during active operations in accordance with an alternative embodiment of the present disclosure.

Referring to FIG. 7, there are shown control signal voltage waveforms for performing a masking operation on one or more unselected memory cells 12 along an active row to reduce a disturbance during active operations in accordance with an alternative embodiment of the present disclosure. For example, during one or more active operations (e.g., read operation, write operation, sense operation, preparation to start/end operation, and/or refresh operation), voltage potentials may be applied to every memory cell 12 along an active row via a corresponding word line (WL) 28, a corresponding source line (CN) 30, and/or a corresponding carrier injection line (EP) 34. However, while the active operations may be performed on one or more selected memory cells 12 along the active row, one or more unselected memory cells 12 along the active row may experience a disturbance caused by the voltage potentials applied via the corresponding word line (WL) 28, the corresponding source line (CN) 30, and/or the corresponding carrier injection line (EP) 34 during the active operations. In order to reduce a disturbance experienced by the one or more unselected memory cells 12 along the active row, a masking operation may be performed on the one or more unselected memory cells 12.

In an exemplary embodiment, during a masking operation, a voltage potential may be applied to the one or more unselected memory cells 12 on the active row via a corresponding bit line (EN("Mask")) 32. The voltage potential applied via the corresponding bit line (EN ("Mask")) 32 to the one or more unselected memory cells 12 on the active row may be raised to a predetermined voltage potential. In an exemplary embodiment, the voltage potential applied to the corresponding bit line (EN("Mask")) 32 associated with the one or more unselected memory cells 12 along the active row may be 0.7V in order to reduce a disturbance caused by the active operations.

At this point it should be noted that providing a direct injection semiconductor memory device in accordance with the present disclosure as described above may involve the processing of input data and the generation of output data to some extent. This input data processing and output data generation may be implemented in hardware or software. For example, specific electronic components may be employed in a direct injection semiconductor memory device or similar or related circuitry for implementing the functions associated with providing a direct injection semiconductor memory device in accordance with the present disclosure as described above. Alternatively, one or more processors operating in accordance with instructions may implement the functions associated with providing a direct injection semiconductor memory device in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for biasing a direct injection semiconductor memory device comprising the steps of:
   applying a first non-negative voltage potential to a first region via a bit line;
   applying a second non-negative voltage potential to a second region via a source line;
   applying a third voltage potential to a word line, wherein the word line is spaced apart from and capacitively coupled to a body region that is electrically floating and disposed between the first region and the second region;
   applying a fourth positive voltage potential to a third region via a carrier injection line, wherein the first region, the body region, the second region, and the third region are disposed in a sequential configuration in the semiconductor memory device; and
   increasing the second non-negative voltage potential applied to the second region from a value applied during a hold operation to a value applied to perform a preparation to start operation.

2. The method according to claim 1, further comprising increasing the third voltage potential applied to the word line from a value applied during the hold operation to a value applied to perform a read operation.

3. The method according to claim 2, further comprising increasing the second non-negative voltage potential applied to the second region from a value applied during the hold operation to a value applied to perform the read operation.

4. The method according to claim 2, further comprising increasing the first non-negative voltage potential applied to the first region from a value applied during the hold operation to a value applied to reduce a disturbance during the read operation.

5. The method according to claim 1, further comprising decreasing the second non-negative voltage potential applied to the second region from a value applied during the hold operation to a value applied to perform a write logic high operation.

6. The method according to claim 5, further comprising increasing the third voltage potential applied to the word line from a value applied during the hold operation to a value applied to perform the write logic high operation.

7. The method according to claim 5, further comprising maintaining the first non-negative voltage potential applied to the first region at a value that is applied to perform both the hold operation and the write logic high operation.

8. The method according to claim 1, further comprising increasing the third voltage potential applied to the word line from a value applied during the hold operation to a value applied to perform a write logic low operation.

9. The method according to claim 8, further comprising increasing the second non-negative voltage potential applied to the second region from a value applied during the hold operation to a value applied to perform the write logic low operation.

10. The method according to claim 8, further comprising maintaining the first non-negative voltage potential applied to the first region at a value that is applied to perform both the hold operation and the write logic low operation.

11. The method according to claim 8, further comprising increasing the first non-negative voltage potential applied to the first region during the write logic low operation from a value applied during the hold operation to maintain a logic high stored in the memory cell.

12. A method for biasing a direct injection semiconductor memory device comprising the steps of:
applying a first voltage potential to a first region via a bit line, wherein the first voltage potential is positive during a hold operation;
applying a second voltage potential to a second region via a source line, wherein the second voltage potential is positive during the hold operation;
applying a third voltage potential to a word line, wherein the word line is spaced apart from and capacitively coupled to a body region that is electrically floating and disposed between the first region and the second region;
applying a fourth voltage potential to a third region via a carrier injection line, wherein the fourth voltage potential is positive during the hold operation, wherein the the first region, the body region, the second region, and the third region are disposed in a sequential configuration in the semiconductor memory device; and
increasing the second voltage potential applied to the second region from a value applied during the hold operation to a value applied to perform a preparation to start operation.

13. The method according to claim 12, further comprising increasing the third voltage potential applied to the word line from a value applied during the hold operation to a value applied to perform a read operation.

14. The method according to claim 13, further comprising increasing the second voltage potential applied to the second region from a value applied during the hold operation to a value applied to perform the read operation.

15. The method according to claim 13, further comprising decreasing the first voltage potential applied to the first region from a value applied during the hold operation to a value applied to perform the read operation.

16. The method according to claim 12, further comprising decreasing the first voltage potential applied to the first region from a value applied during the hold operation to a value applied to perform a preparation to start operation.

17. The method according to claim 12, further comprising decreasing the second voltage potential applied to the second region from a value applied during the hold operation to a value applied to perform a write logic high operation.

18. The method according to claim 17, further comprising increasing the third voltage potential applied to the word line from a value applied during the hold operation to a value applied to perform the write logic high operation.

19. The method according to claim 17, further comprising increasing the first voltage potential applied to the first region from a value applied during a read operation to a value applied to perform the write logic high operation.

20. The method according to claim 12, further comprising increasing the third voltage potential applied to the word line from a value applied during the hold operation to a value applied to perform a write logic low operation.

21. The method according to claim 20, further comprising increasing the second voltage potential applied to the second region from a value applied during the hold operation to a value applied to perform the write logic low operation.

22. The method according to claim 20, further comprising decreasing the first voltage potential applied to the first region from a value applied during the hold operation to a value applied to perform the write logic low operation.

23. The method according to claim 20, further comprising increasing the first non-negative voltage potential applied to the first region during the write logic low operation from a value applied during the hold operation to maintain a logic high stored in the memory cell.

* * * * *

UNITED STATES PATENT AND TRADEMARK OFFICE
CERTIFICATE OF CORRECTION

PATENT NO. : 8,587,996 B2
APPLICATION NO. : 12/843212
DATED : November 19, 2013
INVENTOR(S) : Yogesh Luthra Page 1 of 1

It is certified that error appears in the above-identified patent and that said Letters Patent is hereby corrected as shown below:

In the Claims

In column 21, line 27, in Claim 12, delete "the the" and insert -- the --, therefor.

Signed and Sealed this
Eleventh Day of February, 2014

Michelle K. Lee
*Deputy Director of the United States Patent and Trademark Office*